United States Patent
Choi et al.

(10) Patent No.: US 9,024,388 B2
(45) Date of Patent: May 5, 2015

(54) METHODS OF FORMING GATE STRUCTURES FOR CMOS BASED INTEGRATED CIRCUIT PRODUCTS AND THE RESULTING DEVICES

(71) Applicant: GlobalFoundries Inc., Grand Cayman (KY)

(72) Inventors: Kisik Choi, Hopewell Junction, NY (US); Ruilong Xie, Niskayuna, NY (US)

(73) Assignee: GLOBALFOUNDRIES Inc., Grand Cayman (KY)

(*) Notice: Subject to any disclaimer, the term of this patent is extended or adjusted under 35 U.S.C. 154(b) by 0 days.

(21) Appl. No.: 13/919,676

(22) Filed: Jun. 17, 2013

(65) Prior Publication Data

US 2014/0367790 A1    Dec. 18, 2014

(51) Int. Cl.
| | |
|---|---|
| *H01L 29/43* | (2006.01) |
| *H01L 29/45* | (2006.01) |
| *H01L 29/772* | (2006.01) |
| *H01L 21/28* | (2006.01) |
| *H01L 21/8234* | (2006.01) |
| *H01L 27/092* | (2006.01) |
| *H01L 21/8238* | (2006.01) |

(52) U.S. Cl.
CPC .. *H01L 21/823443* (2013.01); *H01L 21/28008* (2013.01); *H01L 27/092* (2013.01); *H01L 21/823842* (2013.01); *H01L 21/823835* (2013.01)

(58) Field of Classification Search
None
See application file for complete search history.

(56) References Cited

U.S. PATENT DOCUMENTS

| | | | |
|---|---|---|---|
| 2004/0198009 A1* | 10/2004 | Chen et al. | 438/303 |
| 2010/0285659 A1* | 11/2010 | Rho | 438/593 |
| 2013/0264652 A1* | 10/2013 | Zhu et al. | 257/369 |
| 2013/0337656 A1* | 12/2013 | Chambers et al. | 438/763 |
| 2014/0246729 A1* | 9/2014 | Jang et al. | 257/377 |

OTHER PUBLICATIONS

Machine translation of KR 10-2013-022905.*

* cited by examiner

*Primary Examiner* — Joseph Schoenholtz
(74) *Attorney, Agent, or Firm* — Amerson Law Firm, PLLC

(57) ABSTRACT

One illustrative method disclosed herein includes forming replacement gate structures for an NMOS transistor and a PMOS transistor by forming gate insulation layers and a first metal layer for the devices from the same materials and selectively forming a metal-silicide material layer only on the first metal layer for the NMOS device but not on the PMOS device. One example of a novel integrated circuit product disclosed herein includes an NMOS device and a PMOS device wherein the gate insulation layers and the first metal layer of the gate structures of the devices are made of the same material, the gate structure of the NMOS device includes a metal silicide material positioned on the first metal layer of the NMOS device, and a second metal layer that is positioned on the metal silicide material for the NMOS device and on the first metal layer for the PMOS device.

30 Claims, 11 Drawing Sheets

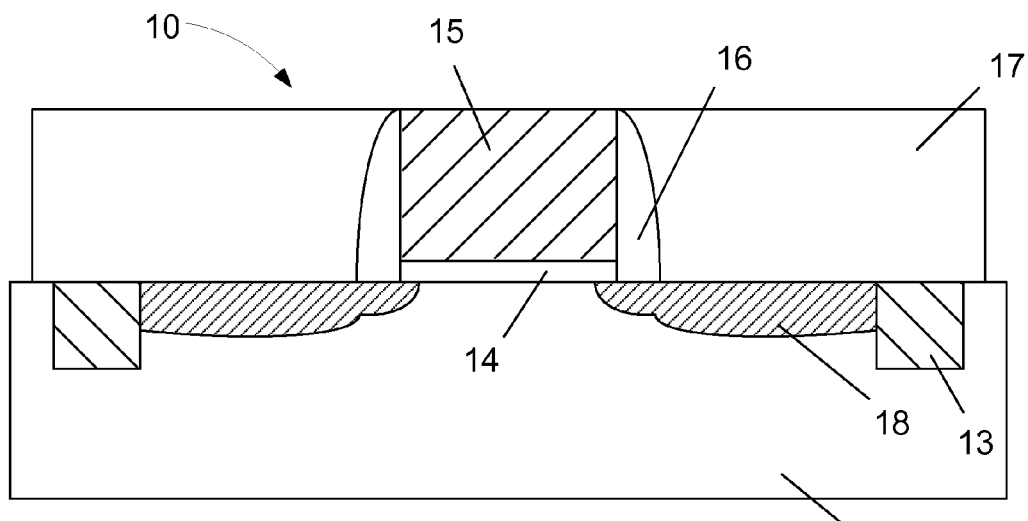
(Prior Art) Figure 1A
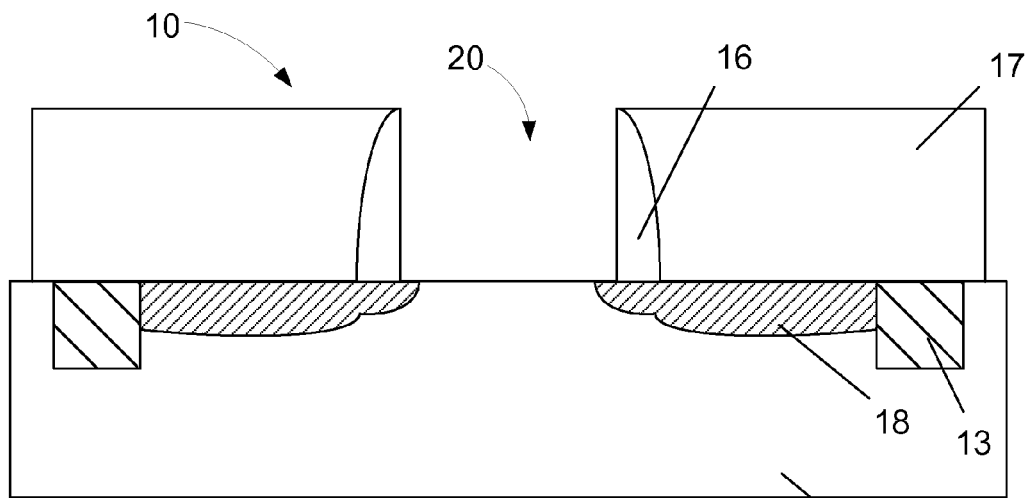
(Prior Art) Figure 1B

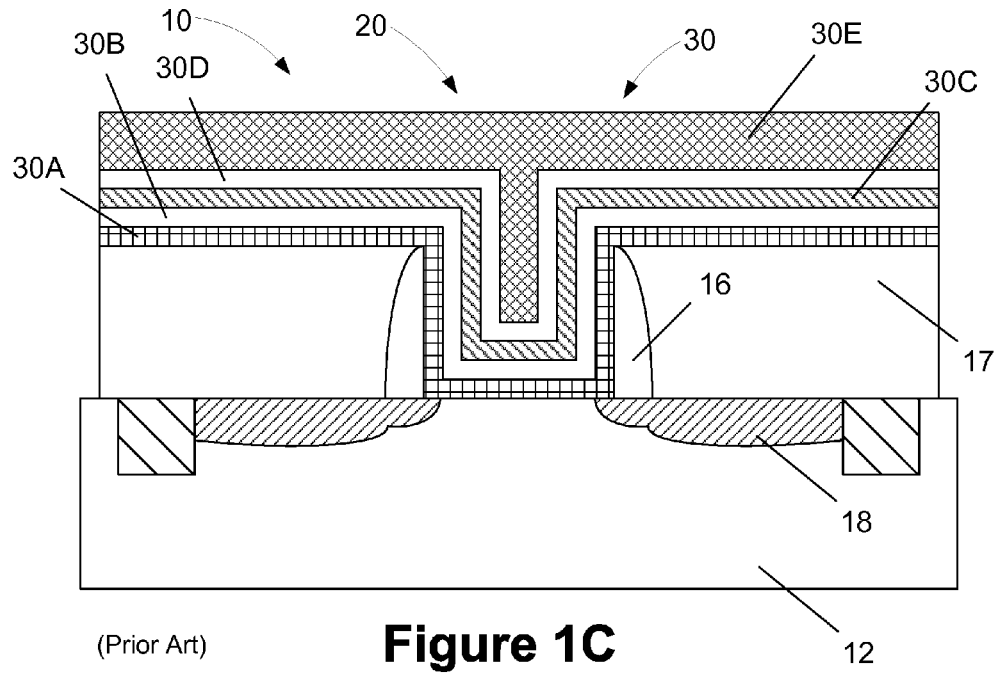
(Prior Art) Figure 1C
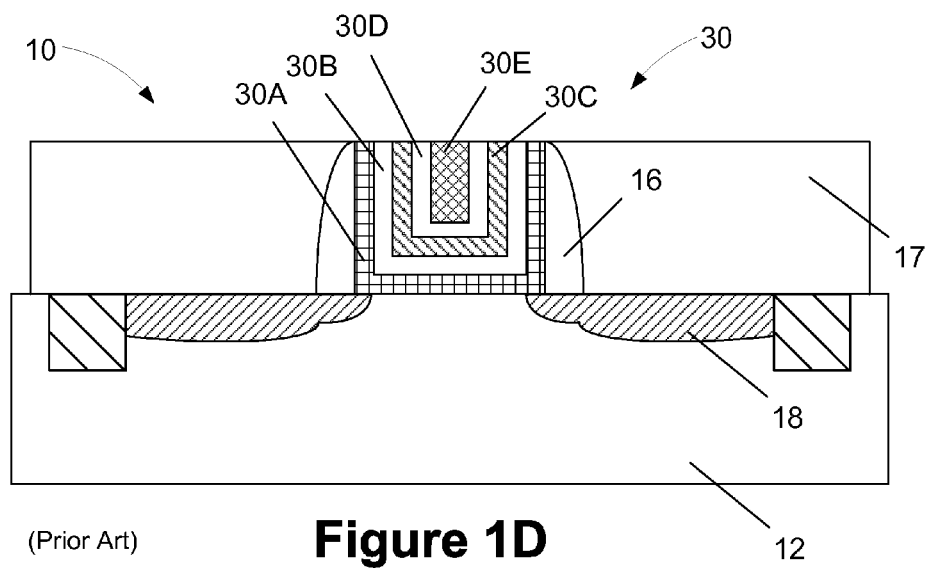
(Prior Art) Figure 1D

METHODS OF FORMING GATE STRUCTURES FOR CMOS BASED INTEGRATED CIRCUIT PRODUCTS AND THE RESULTING DEVICES

BACKGROUND OF THE INVENTION

1. Field of the Invention

Generally, the present disclosure relates to the manufacture of semiconductor devices, and, more specifically, to various novel methods of forming gate structures for CMOS-based integrated circuit products and various novel CMOS-based integrated circuit products.

2. Description of the Related Art

The fabrication of advanced integrated circuits, such as CPU's, storage devices, ASIC's (application specific integrated circuits) and the like, requires the formation of a large number of circuit elements in a given chip area according to a specified circuit layout, wherein so-called metal oxide semiconductor field effect transistors (MOSFETs or FETs) represent one important type of circuit element that substantially determines performance of the integrated circuits. The transistors are typically either NMOS (NFET) or PMOS (PFET) type devices wherein the "N" and "P" designation is based upon the type of dopants used to create the source/drain regions of the devices. So-called CMOS (Complementary Metal Oxide Semiconductor) technology or products refers to integrated circuit products that are manufactured using both NMOS and PMOS transistor devices.

Field effect transistors, whether an NMOS or a PMOS device, typically include a source region, a drain region, a channel region that is positioned between the source region and the drain region, and a gate electrode positioned above the channel region. Current flow through the FET is controlled by controlling the voltage applied to the gate electrode. For an NMOS device, if there is no voltage (or a logically low voltage) applied to the gate electrode, then there is no current flow through the device (ignoring undesirable leakage currents, which are relatively small). However, when an appropriate positive voltage (or logically high voltage) is applied to the gate electrode, the channel region of the NMOS device becomes conductive, and electrical current is permitted to flow between the source region and the drain region through the conductive channel region. For a PMOS device, the control voltages are reversed. Field effect transistors may come in a variety of different physical shapes, e.g., so-called planar FET devices or so-called 3-D or FinFET devices.

For many decades, planar FET devices were the dominant choice for making integrated circuit products due to the relatively easier manufacturing methods that are used to form such planar devices as compared to the manufacturing methods involved in forming 3-D devices. To improve the operating speed of planar FETs, and to increase the density of planar FETs on an integrated circuit device, device designers have greatly reduced the physical size of planar FETs over the years. More specifically, the channel length of planar FETs has been significantly decreased, which has resulted in improving the switching speed of planar FETs. However, decreasing the channel length of a planar FET also decreases the distance between the source region and the drain region. In some cases, this decrease in the separation between the source and the drain regions makes it difficult to efficiently inhibit the electrical potential of the source region and the channel from being adversely affected by the electrical potential of the drain region. This is sometimes referred to as so-called short channel effects, wherein the characteristic of the planar FET as an active switch is degraded.

As noted above, in contrast to a planar FET, a so-called 3-D or FinFET device has a three-dimensional (3D) structure. More specifically, in a FinFET, a generally vertically positioned fin-shaped active area is formed in a semiconductor substrate and a gate structure (gate insulation layer plus the gate electrode) is positioned around both of the sides and the upper surface of the fin-shaped active area to form a tri-gate structure so as to use a channel having a three-dimensional structure instead of a planar structure. In some cases, an insulating cap layer, e.g., silicon nitride, is positioned at the top of the fin and the FinFET device only has a dual-gate structure. Unlike a planar FET, in a FinFET device, a channel is formed perpendicular to a surface of the semiconducting substrate so as to reduce the physical size of the semiconductor device. Also, in a FinFET, the junction capacitance at the drain region of the device is greatly reduced, which tends to reduce at least some short channel effects. When an appropriate voltage is applied to the gate electrode of a FinFET device, the surfaces (and the inner portion near the surface) of the fins, i.e., the substantially vertically oriented sidewalls and the top upper surface of the fin, become a conductive channel region thereby allowing current to flow. In a FinFET device, the "channel-width" is approximately two times (2×) the vertical fin-height plus the width of the top surface of the fin, i.e., the fin width. Multiple fins can be formed in the same foot-print as that of a planar transistor device. Accordingly, for a given plot space (or foot-print), FinFETs tend to be able to generate significantly stronger drive currents than planar transistor devices. Additionally, the leakage current of FinFET devices after the device is turned "OFF" is significantly reduced as compared to the leakage current of planar FETs due to the superior gate electrostatic control of the "fin" channel on FinFET devices. In short, the 3D structure of a FinFET device is a superior MOSFET structure as compared to that of a planar FET, especially in the 20 nm CMOS technology node and beyond.

For many early device technology generations, the gate structures of most transistor elements has been comprised of a plurality of silicon-based materials, such as a silicon dioxide and/or silicon oxynitride gate insulation layer, in combination with a polysilicon gate electrode. However, as the channel length of aggressively scaled transistor elements has become increasingly smaller, many newer generation devices employ gate structures that contain alternative materials in an effort to avoid the short channel effects which may be associated with the use of traditional silicon-based materials in reduced channel length transistors. For example, in some aggressively scaled transistor elements, which may have channel lengths on the order of approximately 10-32 nm or less, gate structures that include a so-called high-k dielectric gate insulation layer and one or metal layers that function as the gate electrode (HK/MG) have been implemented. Such alternative gate structures have been shown to provide significantly enhanced operational characteristics over the heretofore more traditional silicon dioxide/polysilicon gate structure configurations.

Depending on the specific overall device requirements, several different high-k materials—i.e., materials having a dielectric constant, or k-value, of approximately 10 or greater—have been used with varying degrees of success for the gate insulation layer in an HK/MG gate electrode structure. For example, in some transistor element designs, a high-k gate insulation layer may include tantalum oxide ($Ta_2O_5$), hafnium oxide ($HfO_2$), zirconium oxide ($ZrO_2$), titanium oxide ($TiO_2$), aluminum oxide ($Al_2O_3$), hafnium silicates ($HfSiO_x$) and the like. Furthermore, one or more non-polysilicon metal gate electrode materials—i.e., a metal gate stack—may be used in HK/MG configurations so as to control the work function of the transistor. These metal gate electrode materials may include, for example, one or more layers of titanium (Ti), titanium nitride (TiN), titanium-aluminum (TiAl), titanium-aluminum-carbon (TiALC), aluminum (Al), aluminum nitride (AlN), tantalum (Ta), tantalum nitride (TaN), tantalum carbide (TaC), tantalum carbonitride (TaCN), tantalum silicon nitride (TaSiN), tantalum silicide (TaSi) and the like.

One well-known processing method that has been used for forming a transistor with a high-k/metal gate structure is the so-called "gate last" or "replacement gate" technique. The replacement gate process may be used when forming planar devices or 3-D devices. FIGS. 1A-1D simplistically depict one illustrative prior art method for forming an HK/MG replacement gate structure using a replacement gate technique. As shown in FIG. 1A, the process includes the formation of a basic transistor structure above a semiconducting substrate 12 in an active area defined by a shallow trench isolation structure 13. At the point of fabrication depicted in FIG. 1A, the device 10 includes a sacrificial gate insulation layer 14, a dummy or sacrificial gate electrode 15, sidewall spacers 16, a layer of insulating material 17 and source/drain regions 18 formed in the substrate 12. The various components and structures of the device 10 may be formed using a variety of different materials and by performing a variety of known techniques. For example, the sacrificial gate insulation layer 14 may be comprised of silicon dioxide, the sacrificial gate electrode 15 may be comprised of polysilicon, the sidewall spacers 16 may be comprised of silicon nitride and the layer of insulating material 17 may be comprised of silicon dioxide. The source/drain regions 18 may be comprised of implanted dopant materials (N-type dopants for NMOS devices and P-type dopants for PMOS devices) that are implanted into the substrate 12 using known masking and ion implantation techniques. Of course, those skilled in the art will recognize that there are other features of the transistor 10 that are not depicted in the drawings for purposes of clarity. For example, so-called halo implant regions are not depicted in the drawings, as well as various layers or regions of silicon/germanium that are typically found in high performance PMOS transistors. At the point of fabrication depicted in FIG. 1A, the various structures of the device 10 have been formed and a chemical mechanical polishing (CMP) process has been performed to remove any materials above the sacrificial gate electrode 15 (such as a protective cap layer (not shown) comprised of silicon nitride) so that at least the sacrificial gate electrode 15 may be removed.

As shown in FIG. 1B, one or more etching processes are performed to remove the sacrificial gate electrode 15 and the sacrificial gate insulation layer 14 to thereby define a gate cavity 20 where a replacement gate structure will subsequently be formed. Typically, the sacrificial gate insulation layer 14 is removed as part of the replacement gate technique, as depicted herein. However, the sacrificial gate insulation layer 14 may not be removed in all applications.

Next, as shown in FIG. 1C, various layers of material that will constitute a replacement gate structure 30 are formed in the gate cavity 20. Even in cases where the sacrificial gate insulation layer 14 is intentionally removed, there will typically be a very thin native oxide layer (not shown) that forms on the substrate 12 within the gate cavity 20. The materials used for the replacement gate structures 30 for NMOS and PMOS devices are typically different. For example, the replacement gate structure 30 for an NMOS device may be comprised of a high-k gate insulation layer 30A, such as hafnium oxide, having a thickness of approximately 2 nm, a first metal layer 30B (e.g., a layer of titanium nitride with a thickness of about 1-2 nm), a second metal layer 30C—a so-called work function adjusting metal layer for the NMOS device—(e.g., a layer of titanium-aluminum or titanium-aluminum-carbon with a thickness of about 5 nm), a third metal layer 30D (e.g., a layer of titanium nitride with a thickness of about 1-2 nm) and a bulk metal layer 30E, such as aluminum or tungsten. Ultimately, as shown in FIG. 1D, one or more CMP processes are performed to remove excess portions of the gate insulation layer 30A, the first metal layer 30B, the second metal layer 30C, the third metal layer 30D and the bulk metal layer 30E positioned outside of the gate cavity 20 to thereby define the replacement gate structure 30 for an illustrative NMOS device. Typically, the replacement metal gate structure 30 for a PMOS device does not include as many metal layers as does an NMOS device. For example, the gate structure 30 for a PMOS device may only include the high-k gate insulation layer 30A, a single layer of titanium nitride—the work function adjusting metal for the PMOS device—having a thickness of about 3-4 nm, and the bulk metal layer 30E.

As the gate length of transistor devices has decreased, the physical size of the gate cavity 20 has also decreased. Thus, it is becoming physically difficult to fit all of the needed layers of material needed for the replacement gate structure 30, particularly for NMOS devices due to the greater number of layers of material that are typically used to form the gate structures for the NMOS devices, within the reduced-size gate cavity. For example, as gate lengths continue to decrease, voids or seams may be formed as the various layers of material are deposited into the gate cavity 20. Such voids or seams may result in devices that perform at levels less than anticipated or, in some cases, the formation of devices that are simply not acceptable and have to be discarded.

The present disclosure is directed to various methods of forming gate structures for CMOS-based integrated circuit products and various CMOS-based integrated circuit products that may solve or reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various novel methods of forming gate structures for CMOS-based integrated circuit products and various novel CMOS-based integrated circuit products. One illustrative method disclosed herein includes forming replacement gate structures for an NMOS transistor and a PMOS transistor by performing at least one etching process to remove a sacrificial gate structure for the NMOS and PMOS transistors to thereby define NMOS and PMOS gate cavities, respectively, depositing a gate insulation layer in the NMOS and PMOS gate cavities, depositing a first metal layer on the gate insulation layers in the NMOS and PMOS gate cavities, performing at least one process operation to selectively form a metal-silicide material layer only on the first metal layer within the NMOS gate cavity but not on the first metal layer within the PMOS gate cavity, and forming gate cap layers within the NMOS and PMOS gate cavities.

Another illustrative method disclosed herein includes forming replacement gate structures for an NMOS transistor and a PMOS transistor by performing at least one etching process to remove a sacrificial gate structure for the NMOS and PMOS transistors to thereby define NMOS and PMOS gate cavities, respectively, depositing a gate insulation layer in the NMOS and PMOS gate cavities, depositing a first metal layer on the gate insulation layers in the NMOS and PMOS gate cavities, performing at least one first process operation to form a silicon-containing material layer on the first metal layer in the NMOS gate cavity and on the first metal layer within the PMOS gate cavity, performing at least one second process operation to selectively remove the silicon-containing material layer from within the PMOS gate cavity while leaving the silicon-containing material layer positioned within the NMOS gate cavity and thereby expose the first metal layer within the PMOS gate cavity, depositing a second metal layer on the silicon-containing material layer within the NMOS gate cavity and on the exposed first metal layer within the PMOS gate cavity, converting at least a portion of the silicon-containing material layer within the NMOS gate cavity into a metal-silicide material that is positioned on the first metal layer in the NMOS gate cavity, and forming gate cap layers within the NMOS and PMOS gate cavities.

One example of a novel integrated circuit product disclosed herein includes an NMOS transistor having a gate structure comprised of an NMOS gate insulation layer comprised of a high-k gate insulation material, a first NMOS metal layer comprised of a first metal positioned on the NMOS gate insulation layer, a metal silicide material positioned on the first NMOS metal layer and a second NMOS metal layer comprised of a second metal positioned on the metal silicide material. The integrated circuit product further includes a PMOS transistor having a gate structure comprised of a PMOS gate insulation layer comprised of the same high-k gate insulation material, a first PMOS metal layer comprised of the same first metal positioned on the PMOS gate insulation layer and a second PMOS metal layer comprised of the same second metal positioned on the first PMOS metal layer.

Another example of a novel integrated circuit product disclosed herein includes an NMOS transistor having a gate structure comprised of an NMOS gate insulation layer comprised of a high-k gate insulation material, a first NMOS metal layer comprised of a first metal positioned on the NMOS gate insulation layer and a metal silicide material positioned on the first NMOS metal layer. The integrated circuit product further includes a PMOS transistor having a gate structure comprised of a PMOS gate insulation layer comprised of the same high-k gate insulation material, a first PMOS metal layer comprised of the same first metal positioned on the PMOS gate insulation layer and a second PMOS metal layer positioned on the first PMOS metal layer.

BRIEF DESCRIPTION OF THE DRAWINGS

The disclosure may be understood by reference to the following description taken in conjunction with the accompanying drawings, in which like reference numerals identify like elements, and in which:

FIGS. 1A-1D depict one illustrative prior art method of forming a gate structure of the transistors using a so-called "replacement gate" technique.

Figure 2A:
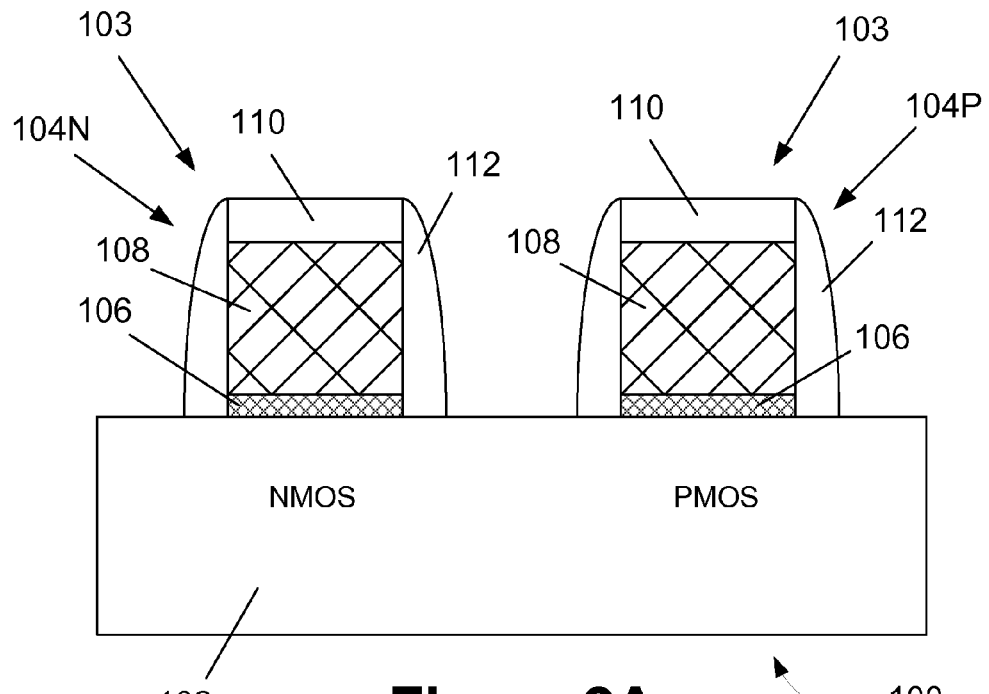
FIGS. 2A-2P depict various illustrative methods disclosed herein for forming gate structures for CMOS-based integrated circuit products and various novel CMOS-based integrated circuit products.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of forming gate structures for CMOS-based integrated circuit products and various CMOS-based integrated circuit products. As will be readily apparent to those skilled in the art upon a complete reading of the present application, the methods disclosed herein may be employed in manufacturing a variety of different devices, including, but not limited to, logic devices, memory devices, etc. With reference to the attached figures, various illustrative embodiments of the methods and devices disclosed herein will now be described in more detail.

As will be appreciated by those skilled in the art after a complete reading of the present application, the inventions disclosed herein may be employed in forming integrated circuit products using planar transistor devices, as well as so-called 3-D devices, such as FiNFETs, or a combination of such devices. For purposes of disclosure, reference will be made to an illustrative process flow wherein an integrated circuit product is formed with a plurality of planar transistor devices using CMOS technology. However, the inventions disclosed herein should not be considered to be limited to such an illustrative example.

FIG. 2A is a simplified view of an illustrative integrated circuit product 100 at an early stage of manufacturing. Illustrative NMOS transistor 104N and PMOS transistor 104P will be formed in and above the semiconductor substrate 102. So as not to obscure the inventions disclosed herein, isolation regions that are formed in the substrate 102 to define active regions where the transistors 104N, 104P will be formed are not depicted in the attached drawings. Additionally, various doped regions, e.g., source/drain regions, halo implant regions, well regions and the like, are also not depicted in the attached drawings. The substrate 102 may have a variety of configurations, such as the depicted bulk silicon configuration. The substrate 102 may also have a silicon-on-insulator (SOI) configuration that includes a bulk silicon layer, a buried insulation layer and an active layer, wherein semiconductor devices are formed in and above the active layer. The substrate 102 may be made of silicon or it may be made of materials other than silicon. Thus, the terms "substrate" or "semiconductor substrate" should be understood to cover all semiconducting materials and all forms of such materials.

In the example disclosed herein, the transistors 104N, 104P will be formed using a replacement gate technique. Accordingly, FIG. 2A depicts the product 100 at a point in fabrication wherein sacrificial gate structures 103 have been formed above the substrate 102. As noted above, at this point in the replacement gate process flow, source/drain regions (not shown) would have already been formed in the substrate 102 and an anneal process would have been performed to activate the implanted dopant materials and repair any damage to the substrate 102 due to the various ion implantation processes that were performed. The sacrificial gates structures 103 include a sacrificial gate insulation layer 106 and a dummy or sacrificial gate electrode 108. Also depicted are illustrative sidewall spacers 112 and illustrative gate cap layers 110. The various components and structures of the product 100 may be formed using a variety of different materials and by performing a variety of known techniques. For example, the sacrificial gate insulation layer 106 may be comprised of silicon dioxide, the sacrificial gate electrode 108 may be comprised of polysilicon, the sidewall spacers 112 and the gate cap layers 110 may be comprised of silicon nitride. The layers of material depicted in FIG. 2A, as well as the layers of materials described below, may be formed by any of a variety of different known techniques, e.g., a chemical vapor deposition (CVD) process, an atomic layer deposition (ALD) process, a thermal growth process, etc.

Figure 2B:
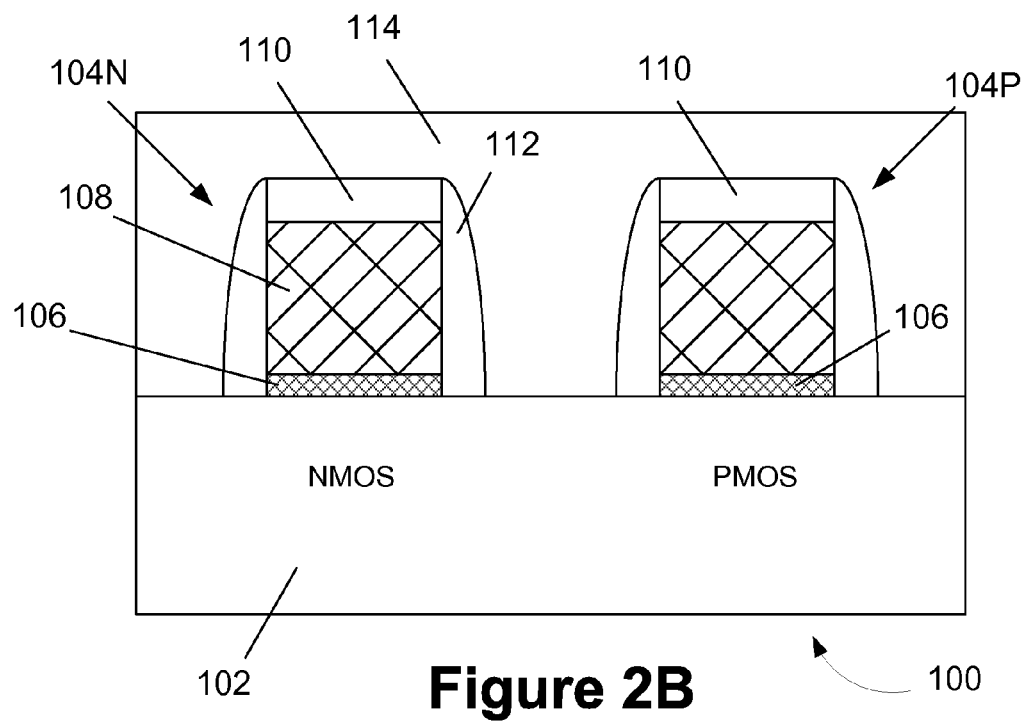

FIG. 2B depicts the product 100 after a layer of insulating material 114, e.g. silicon dioxide, a low-k material (k value less than about 3.3), etc., has been deposited above the product 100. In one embodiment, the layer of insulating material 114 may be a layer of silicon dioxide that is formed by performing a CVD process. The layer of insulating material 114 may be formed to any desired thickness.

Figure 2C:
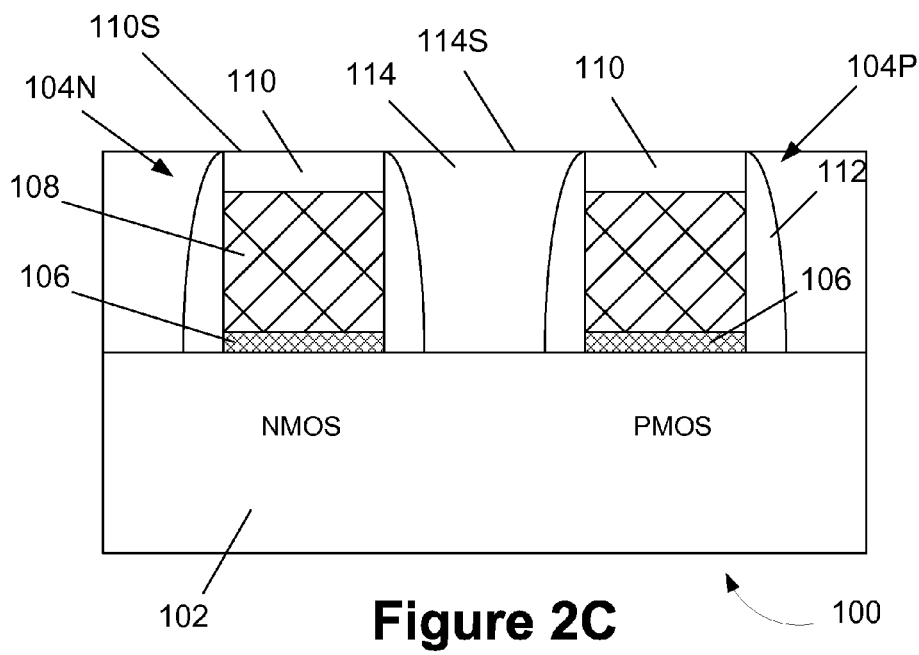

FIG. 2C depicts the product 100 after a planarization process has been performed on the layer of insulating material 114 such that the upper surface 114S of the layer of insulating material 114 is substantially even with the upper surface 110S of the gate cap layers 110. Importantly, this planarization process exposes the upper surface 110S of the gate cap layers 110 such that they can be removed. In one illustrative embodiment, the planarization process may be a chemical mechanical planarization (CMP) process that stops on the gate cap layers 110, or it may be a timed etch-back process that removes the layer of insulating material 114 selectively relative to the gate cap layers 110.

Figure 2D:
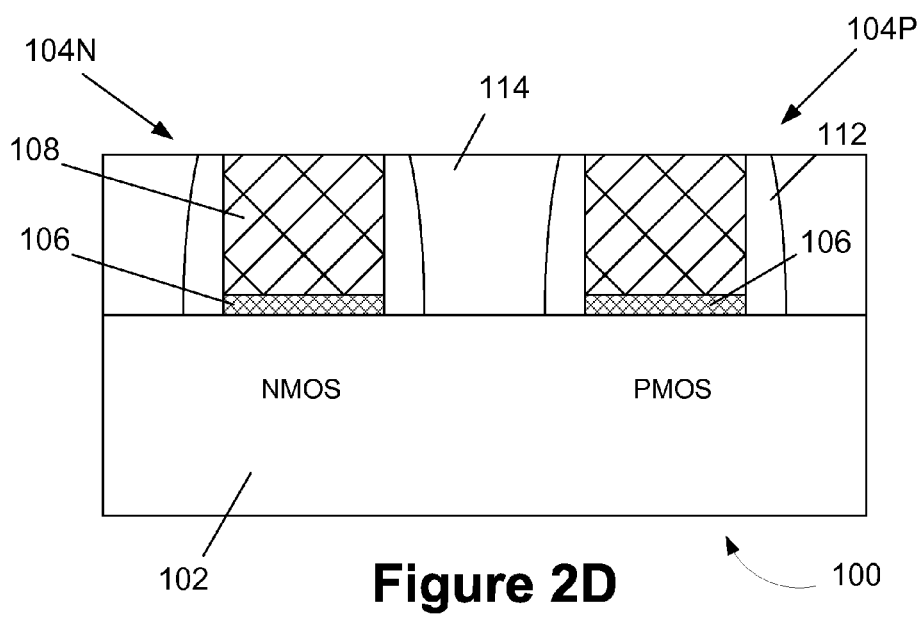

FIG. 2D depicts the product 100 after one or more additional planarization processes have been performed to remove the gate cap layers 110 and expose the sacrificial gate electrode 108. In one example, the structure depicted in FIG. 2D may be achieved by initially performing a dry etching process to remove the gate cap layers 110 selectively relative to the sacrificial gate electrode 108, followed by performing another CMP process that stops on the now-exposed sacrificial gate electrode 108. Those skilled in the art will recognize that there are other processing sequences that can be performed so as to result in the structure depicted in FIG. 2D. Whatever particular processing sequence is selected, the sacrificial gate electrode 108 is exposed and ready to be removed.

Figure 2E:
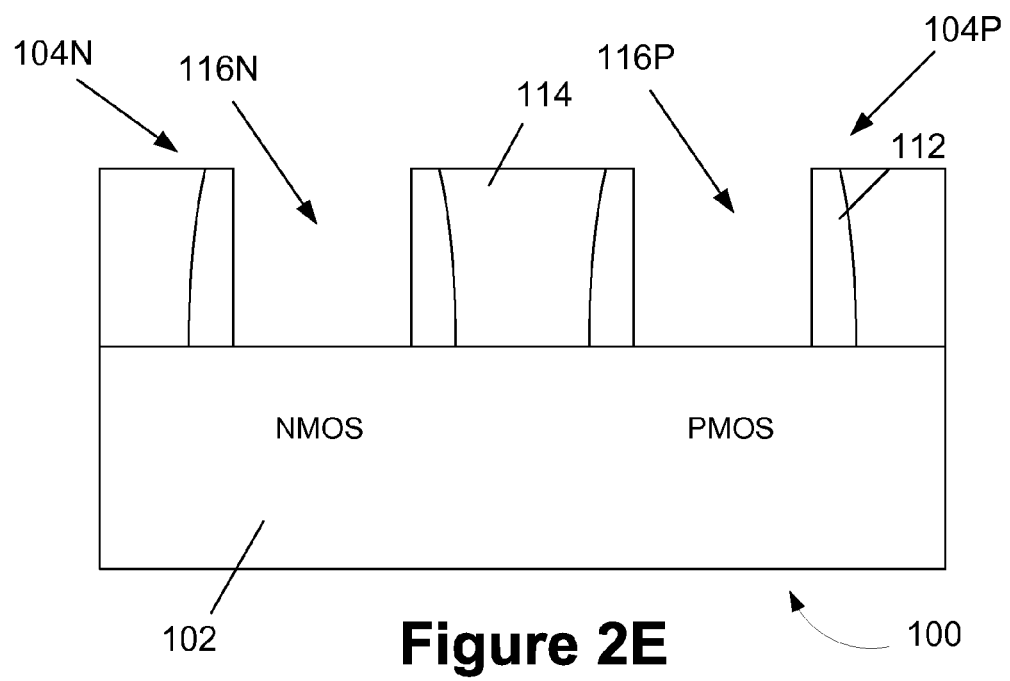

Next, as shown in FIG. 2E, one or more wet or dry etching processes are performed to remove the sacrificial gate electrode 108 and the sacrificial gate insulation layer 106 to thereby define gate cavities 116N, 116P where a replacement gate structure will subsequently be formed for the transistors 104N, 104P, respectively. Typically, the sacrificial gate insulation layer 106 is removed as part of the replacement gate technique, as depicted herein. However, the sacrificial gate insulation layer 106 may not be removed in all applications. Even in cases where the sacrificial gate insulation layer 106 is intentionally removed, there will typically be a very thin native oxide layer (not shown) that forms on the substrate 102 within the gate cavities 116N, 116P.

Figure 2F:
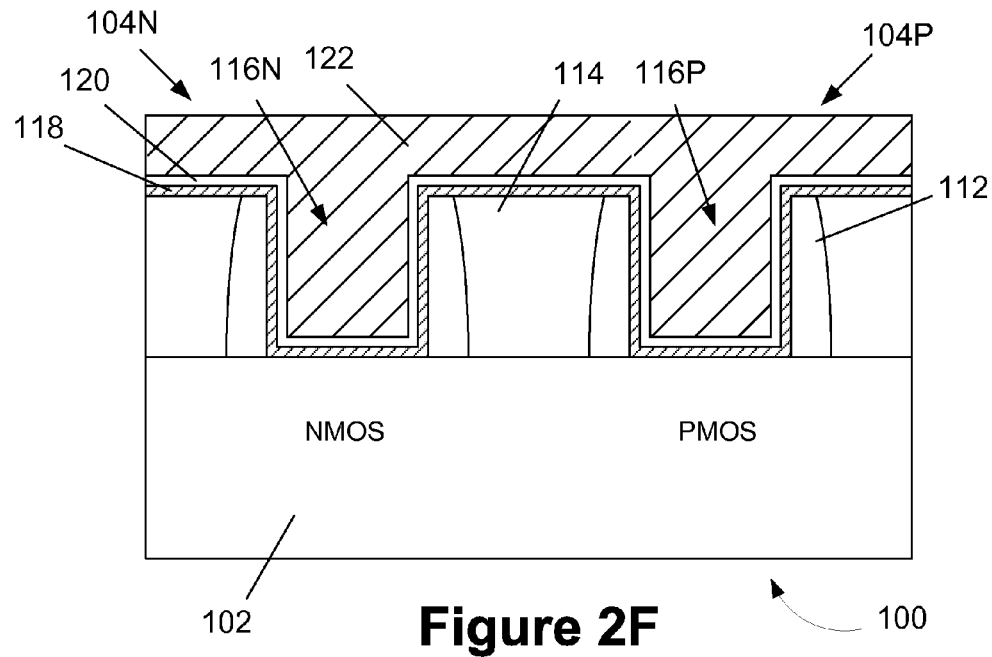

FIG. 2F depicts the product after several process operations were performed. First, a pre-clean process was performed in an attempt to remove all foreign materials from within the gate cavities 116N, 116P prior to forming the various layers of material that will become part of the replacement gate structures. Thereafter, a high-k (k value greater than 10) gate insulation layer 118, such as hafnium oxide, having a thickness of approximately 2 nm was initially deposited in the gate cavities 116N, 116P by performing an ALD process. Then, a first metal layer 120 (e.g., a layer of titanium nitride with a thickness of about 1-5 nm) was formed on the high-k gate insulation layer 118 and within the gate cavities 116N, 116P. The first metal layer 120 is comprised of a metal that will serve as the work function adjusting metal for the PMOS transistor 104P and it will act as a barrier layer for both of the transistors 104N, 104P in an anneal process that will be performed to increase the reliability of the high-k gate insulation layer 118, as described more fully below. In one example, the first metal layer 120 may be formed by performing a plasma-enhanced physical vapor deposition (PVD) process. Next, a silicon-containing material layer 122, such as polysilicon or amorphous silicon, is blanket-deposited on the product 100 so as to over-fill the gate cavities 116N, 116P. The silicon-containing material layer 122 may be formed by performing, for example, a CVD process. After the silicon-containing material layer 122 is formed, an anneal process may be performed to increase the reliability of the high-k gate insulation layer 118. The parameters of such an anneal process are well known to those skilled in the art.

Figure 2G:
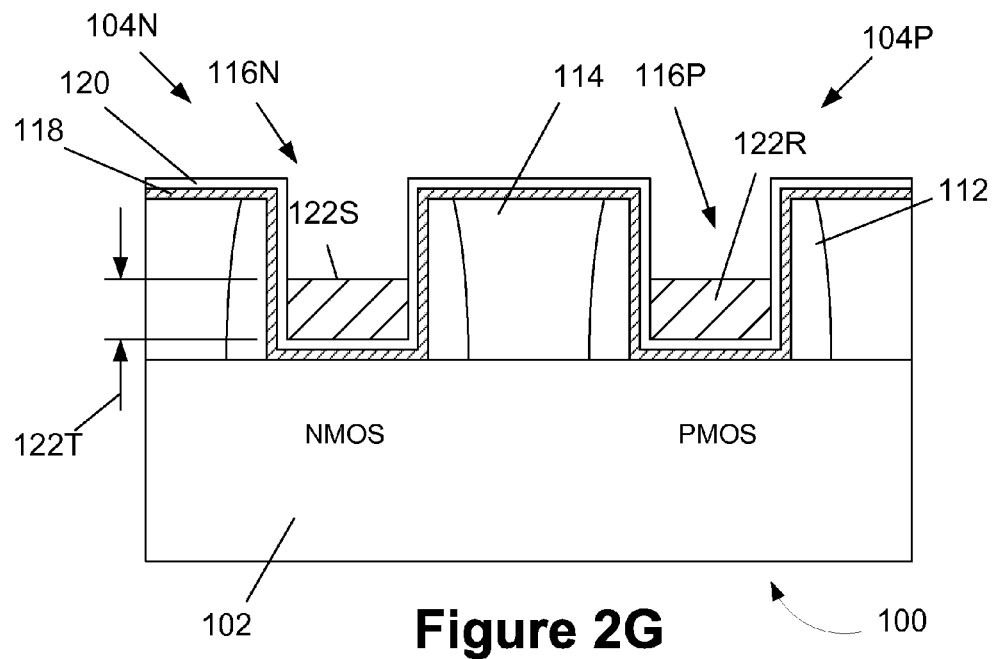

FIG. 2G depicts the product 100 after a dry or wet etching process was performed on the silicon-containing material layer 122 to thereby produce a recessed silicon-containing material layer 122R having a recessed upper surface 122S. This recessing process leaves the recessed silicon-containing material layer 122R positioned only in the gate cavities 116N, 116P. In one illustrative example, the recessing process is performed in such a manner that the thickness 122T of the recessed silicon-containing material layer 122R remaining in the gate cavities 116N, 116P is about 10-20 nm.

Figure 2H:
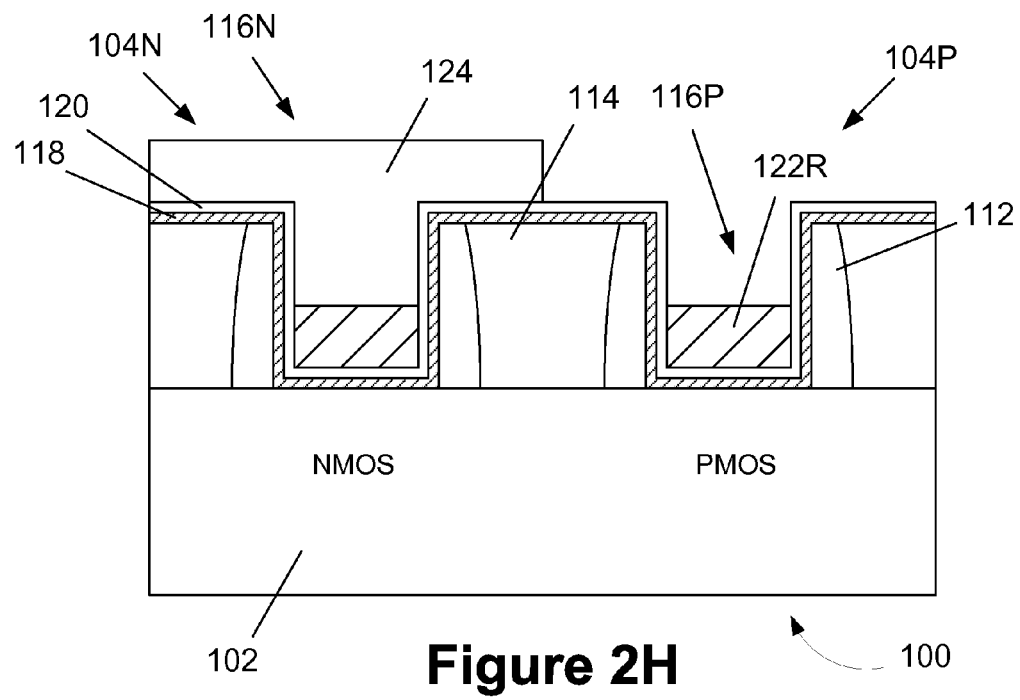

FIG. 2H depicts the product 100 after a patterned masking layer 124 is formed above the product 100. The patterned masking layer 124 covers the NMOS region while leaving the PMOS region exposed for further processing. In one embodiment, the patterned masking layer 124 may be a patterned layer of photoresist material that may be formed using known photolithography tools and techniques.

Figure 2I:
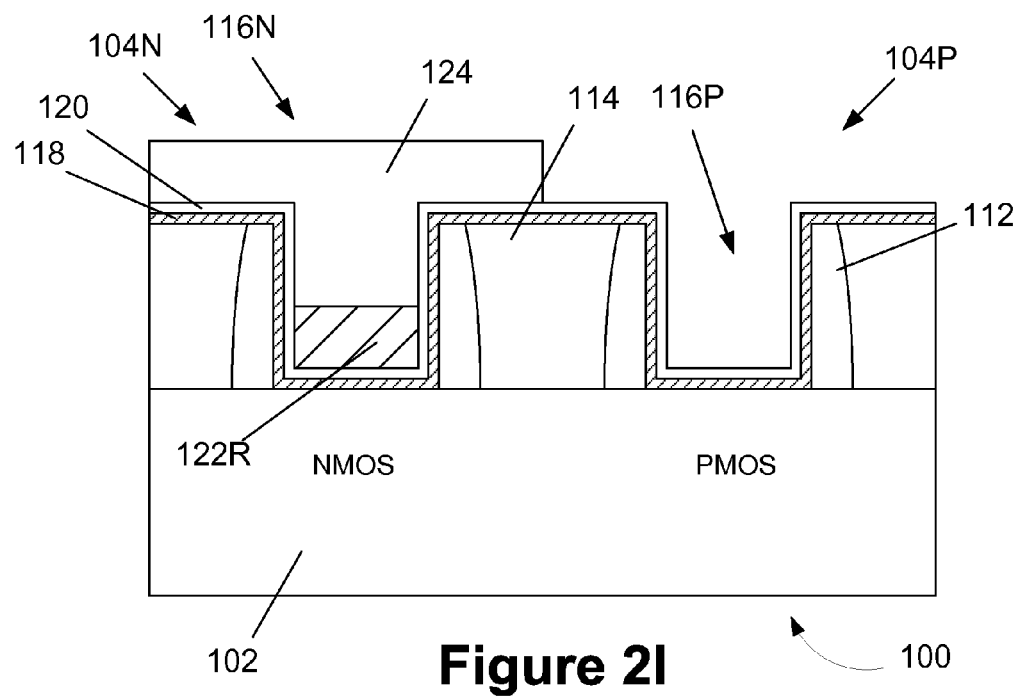

FIG. 2I depicts the product 100 after a dry or wet etching process was performed to remove the recessed silicon-containing material layer 122R from the gate cavity 116P for the PMOS transistor 104P. As a result of this etching process, the remaining recessed silicon-containing material layer 122R is positioned only in the gate cavity 116N for the NMOS transistor 104N.

Figure 2J:
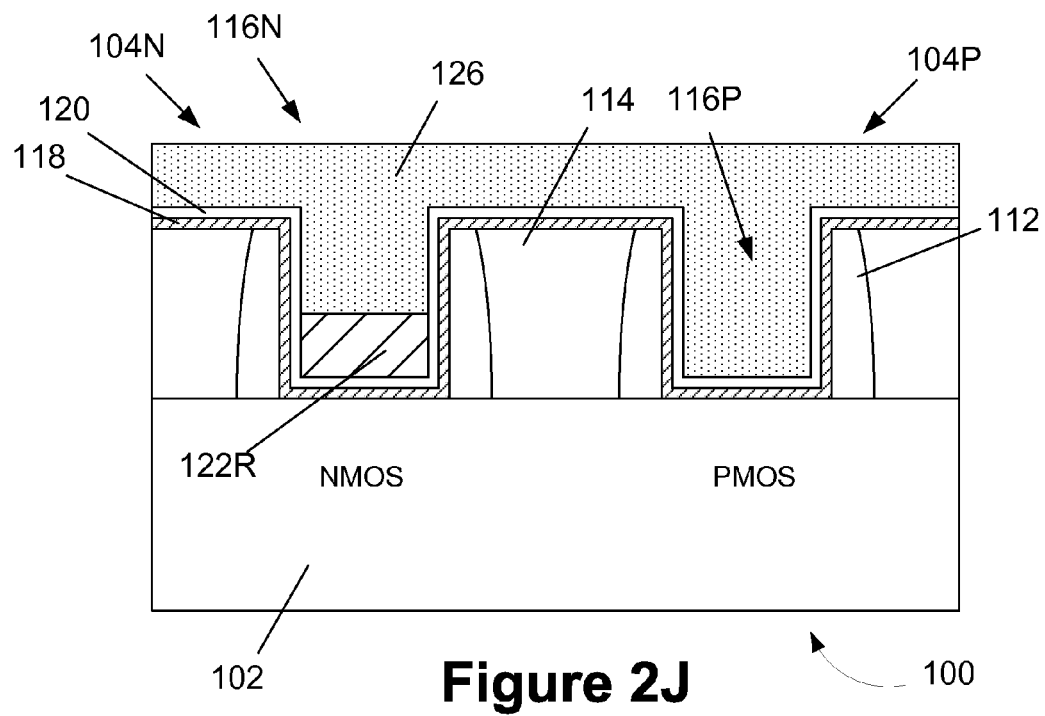

FIG. 2J depicts the product 100 after the patterned mask layer 124 was removed and after a second metal layer 126 was blanket-deposited on the product 100 so as to over-fill the gate cavities 116N, 116P. The second metal layer 126 may be comprised of a variety of materials, e.g., tungsten, a transition metal, a refractory metal, etc., and it may be formed by performing, for example, a CVD or PVD process. The second metal layer 126 may be formed to any desired thickness.

Figure 2K:
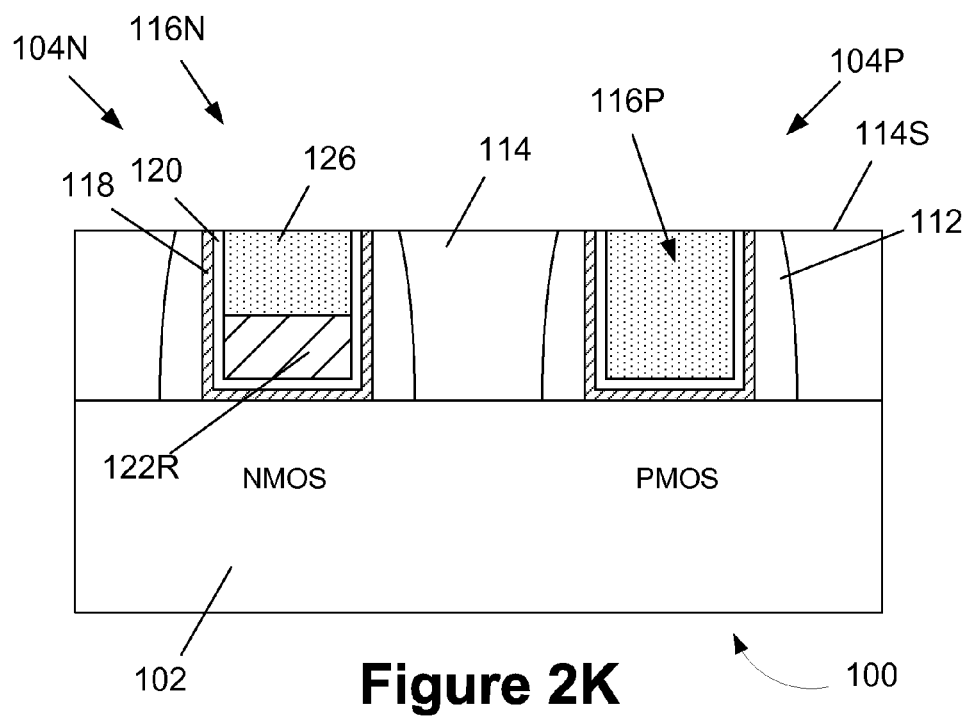

FIG. 2K depicts the product 100 after planarization processes have been performed to remove the portions of the second metal layer 126, the first metal layer 120 and high-k gate insulation layer 118 that are positioned above the surface 114S of the layer of insulating material 114 and outside of the gate cavities 116N, 116P. The structure depicted in FIG. 2K may be achieved by performing one or more CMP and/or etching processes in any of a variety of different processing sequences.

Figure 2L:
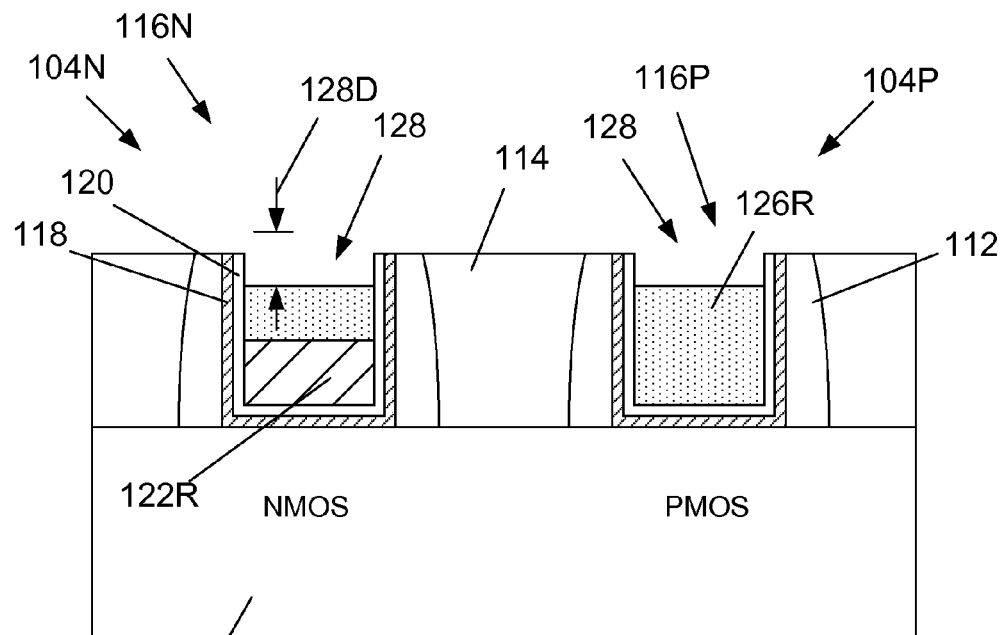

FIG. 2L depicts the product 100 after a dry or wet etching process was performed on the second metal layer 126 to thereby produce a recessed second metal layer 126R having a recessed upper surface. In one embodiment, the recessing process may be a timed etching process. This recessing process results in the definition of recesses 128 within the gate cavities 116N, 116P. In one illustrative example, the recessing process is performed in such a manner that the depth 128D of the recesses 128 is about 20-40 nm.

Figure 2M:
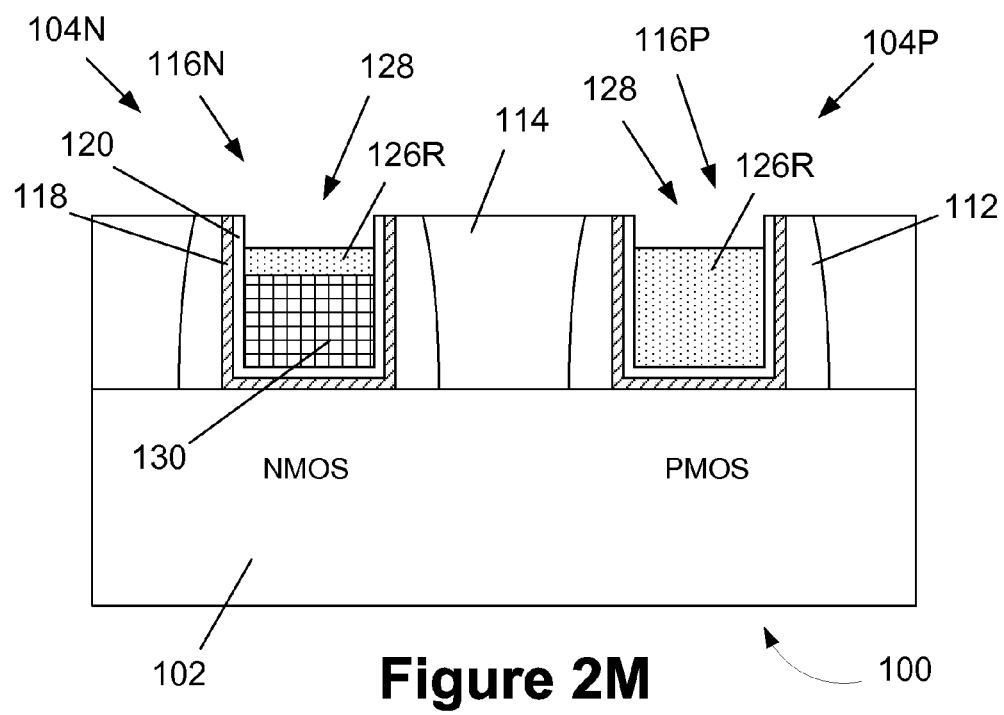

FIG. 2M depicts the product 100 after a silicidation process was performed to form a metal silicide material 130 in the gate cavity 116N for the NMOS transistor 104N. The silicidation process also leaves a portion of the recessed second metal layer 126R positioned above the metal silicide material 130, i.e., some of the recessed second metal layer 126R is not consumed during the silicidation process. In one particularly illustrative embodiment, the metal silicide material is tungsten silicide and the recessed second metal layer 126R is tungsten. The processes and techniques in performing such a silicidation process are well known to those skilled in the art. In one illustrative embodiment, the metal silicide material 130 may have a thickness (in the vertical direction) of about 10-50 nm and the recessed second metal layer 126R positioned above the metal silicide material 130 may have a thickness of about 1-30 nm, based upon current day technology. In some embodiments, the second metal layer 126R may be entirely consumed in the silicidation process that is performed to make the metal silicide material 130. Additionally, if desired, the unreacted portions of the second metal layer 126R may be removed after the metal silicide material 130 is formed.

Figure 2N:
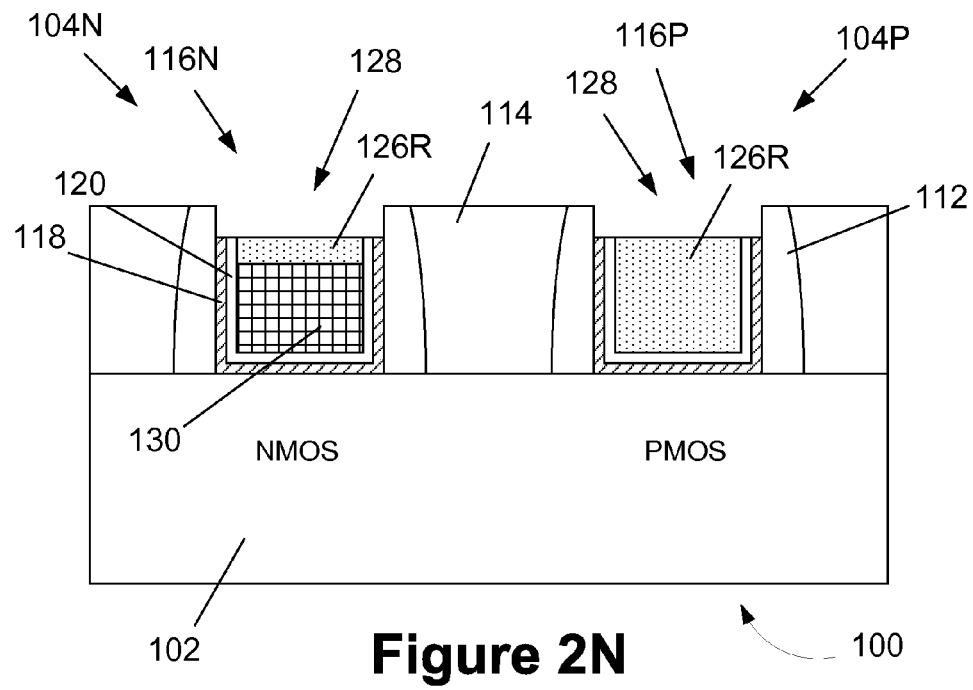

FIG. 2N depicts the product 100 after one or more dry or wet etching processes were performed to remove portions of the high-k gate insulation layer 118 and the first metal layer 120 positioned on the sidewalls within the gate cavities 116N, 116P. As will be appreciated by those skilled in the art after a complete reading of the present application, the removal of these portions of the high-k gate insulation layer 118 and the first metal layer 120 could have also been performed at the point in the process flow shown in FIG. 2L, i.e., prior to the silicidation process.

Figure 2O:
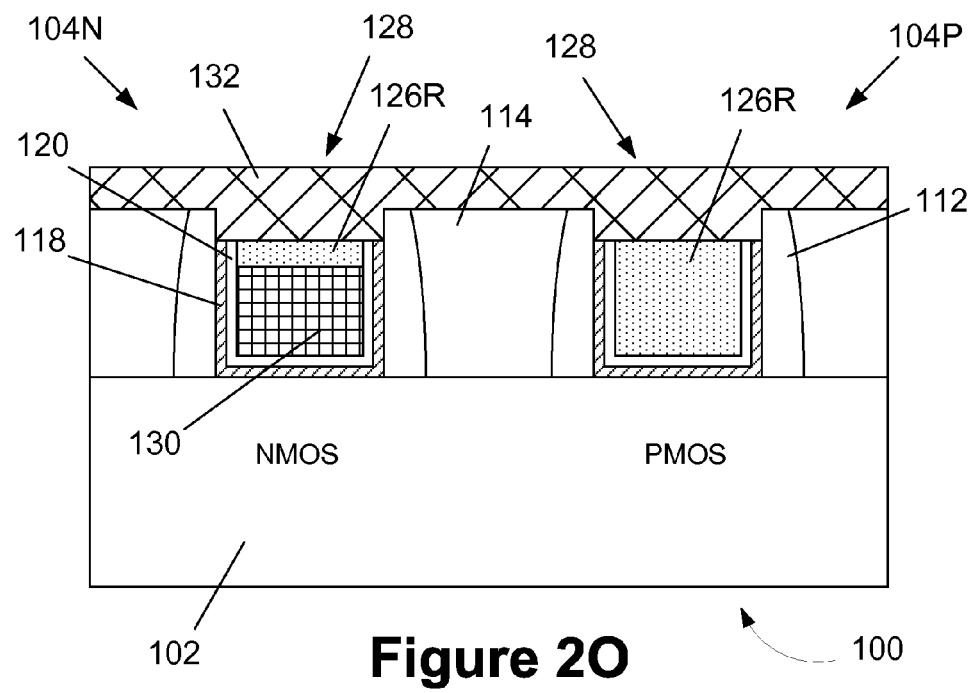

FIG. 2O depicts the product 100 after a layer of gate cap material 132, e.g., silicon nitride, has been blanket-deposited above the product 100. In one embodiment, the layer of gate cap material 132 may be a layer of silicon nitride that is formed by performing a CVD process. The layer of gate cap material 132 may be formed to any desired thickness.

Figure 2P:
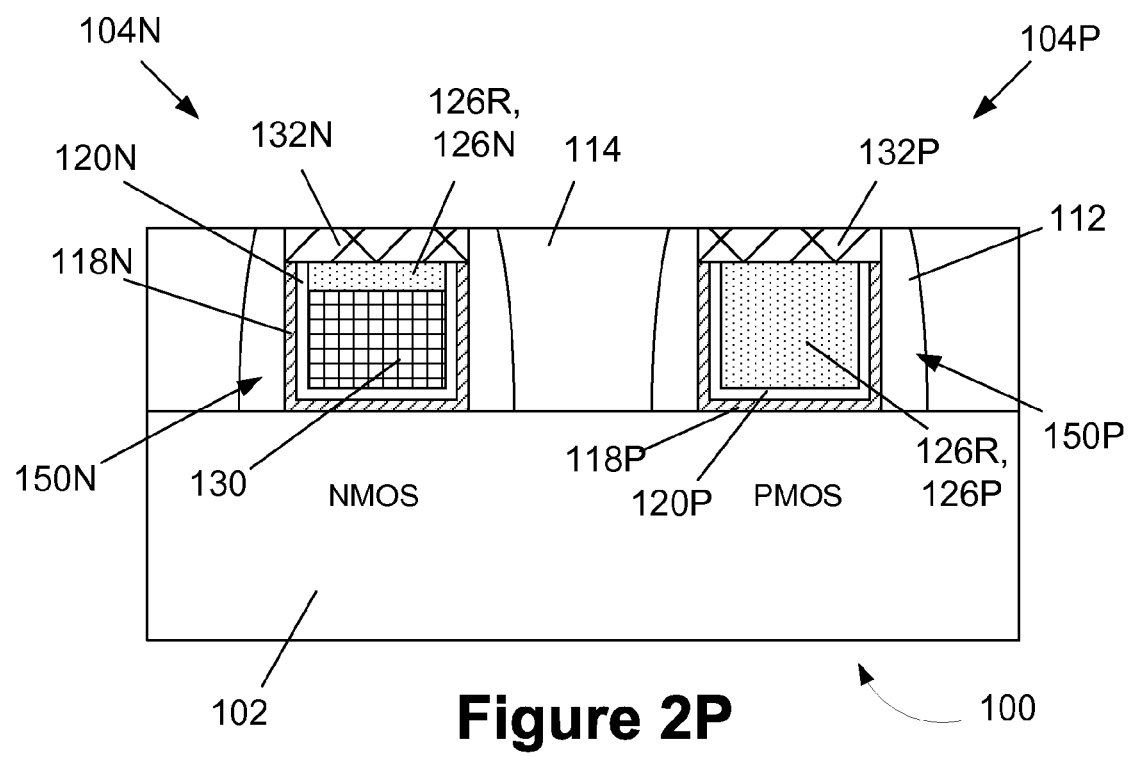

FIG. 2P depicts the product 100 after a planarization process has been performed on the layer of gate cap material 132 to thereby define gate cap layer 132N, 132P for the transistors 104N, 104P, respectively. In one illustrative embodiment, the planarization process may be a chemical mechanical planarization (CMP) process that stops on the layer of insulating material 114.

At this point in the process flow, the final gate structures 150N, 150P have been formed for the transistors 104N, 104P, respectively. The gate cap layers 132N, 132P have also been formed to protect the gate structures 150N, 150P. Using the methods disclosed herein, the stack of material layers for the final gate structure 150N of the NMOS transistor 104N may be formed by depositing fewer layers of material with the gate cavity 116N. The prior art method described above involved performing four conformal deposition processes to form four individual layers of material in the gate cavity 20: the layers 30A, 30B, 30C and 30D, which consumed a substantial portion of the width of the gate cavity 20 for the NMOS device. In one illustrative embodiment of the methods disclosed herein, formation of the final gate structure 150N for the NMOS device only requires performing two conformal deposition processes to form two individual material layers: the layers 118, 120 within the gate cavity 116N. This leaves significantly more room within the gate cavity 116N to form the additional needed metal materials within the gate cavity 116N. In the depicted example, this is achieved by forming a metal silicide material 130 by siliciding a silicon-containing material with a metal material formed thereabove. More importantly, the methodologies disclosed herein are equally compatible with forming replacement gate structures for PMOS devices, as shown above. Thus, the methods disclosed herein have significant value as it relates to forming integrated circuit products using CMOS technology. Other benefits will be apparent to those skilled in the art after a complete reading of the present application. At the point of fabrication depicted in FIG. 2P, the integrated circuit product 100 may be completed by performing several traditional manufacturing processes, e.g., the formation of contacts to the source/drain regions of the device, the formation of various metallization layers for the product, etc.

One illustrative method disclosed herein includes forming replacement gate structures 150N, 150P for an NMOS transistor 104N and a PMOS transistor 104P, respectively, by performing at least one etching process to remove sacrificial gate structures for the NMOS and PMOS transistors to thereby define NMOS and PMOS gate cavities 116N, 116P, respectively, depositing the same gate insulation layer material 118 in both of the NMOS and PMOS gate cavities 116N, 116P, depositing the same first metal layer 120 on the gate insulation layers 118 in the NMOS and PMOS gate cavities 116N, 116P, performing at least one process operation to selectively form a metal-silicide material layer 130 only on the first metal layer 118 (the first NMOS metal layer) within the NMOS gate cavity 116N but not on the first metal layer 118 (the first PMOS metal layer) within the PMOS gate cavity 116P, and forming gate cap layers 132N, 132P within the NMOS and PMOS gate cavities 116N, 116P, respectively.

Note that in the depicted embodiment, a residual portion 126R of the second metal layer 126 remains positioned on the metal silicide region 130 of the NMOS transistor 104N. However, as mentioned above, the residual portion 126R may not be present in all embodiments of the inventions disclosed herein.

Another illustrative method disclosed herein includes forming replacement gate structures for an NMOS transistor 104N and a PMOS transistor 104P by performing at least one etching process to remove the sacrificial gate structures of the NMOS and PMOS transistors to thereby define NMOS and PMOS gate cavities 116N, 116P, respectively, depositing the same gate insulation layer 118 in the NMOS and PMOS gate cavities 116N, 116P, depositing the same first metal layer 120 on the gate insulation layers 118 in the NMOS and PMOS gate cavities 116N, 116P, performing at least one first process operation to form a silicon-containing material layer 122R on the first metal layer 118 (the first NMOS metal layer) in the NMOS gate cavity 116N and on the first metal layer 118 (the first PMOS metal layer) within the PMOS gate cavity 116P, performing at least one second process operation to selectively remove the silicon-containing material 122R layer from within the PMOS gate cavity 116P while leaving the silicon-containing material layer 122R positioned within the NMOS gate cavity 116N and thereby expose the first metal layer 118 (the first PMOS metal layer) within the PMOS gate cavity 116P, depositing the same second metal layer 126 on the silicon-containing material layer 122R within the NMOS gate cavity 116N and on the exposed first metal layer 118 (the first PMOS metal layer) within the PMOS gate cavity 116P, converting at least a portion of the silicon-containing material layer 122R within the NMOS gate cavity 116N into a metal-silicide material 130 that is positioned on the first metal layer 118 (the first NMOS metal layer) in the NMOS gate cavity 116N, and forming gate cap layers 132N, 132P within the NMOS and PMOS gate cavities 116N, 116P, respectively.

With reference to FIG. 2P, one example of a novel integrated circuit product 100 disclosed herein includes an NMOS transistor 104N having a final gate structure 150N comprised of an NMOS gate insulation layer 118N comprised of a high-k gate insulation material, a first NMOS metal layer 120N comprised of a first metal positioned on the NMOS gate insulation layer 118N, a metal silicide material 130 positioned on the NMOS metal layer 120N and a second NMOS metal layer 126N comprised of a second metal positioned on the metal silicide material 130. The integrated circuit product 100 further includes a PMOS transistor 104P having a gate structure 150P comprised of a PMOS gate insulation layer 118P comprised of the same high-k gate insulation material, a first PMOS metal layer 120P comprised of the same first metal positioned on the PMOS gate insulation layer 118P and a second PMOS metal layer 126P comprised of the same second metal positioned on the first PMOS metal layer 120P. As noted above, in some embodiments, the second NMOS metal layer 126N may not be present in the NMOS devices, i.e., the second NMOS metal layer 126 may not be positioned on the metal silicide material 130.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed is:

1. A method of forming replacement gate structures for an NMOS transistor and a PMOS transistor, comprising:
    performing at least one etching process to remove a sacrificial gate structure for said NMOS transistor and a sacrificial gate structure for said PMOS transistor to thereby define an NMOS gate cavity and a PMOS gate cavity;
    depositing a gate insulation layer in said NMOS gate cavity and in said PMOS gate cavity;
    depositing a first metal layer on said gate insulation layer in said NMOS gate cavity and in said PMOS gate cavity;
    performing at least one process operation to selectively form a metal-silicide material layer only on said first metal layer within said NMOS gate cavity but not on said first metal layer within said PMOS gate cavity; and
    forming gate cap layers within said NMOS and PMOS gate cavities.

2. The method of claim 1, wherein said metal-silicide material is a silicide of a refractory metal or a transition metal.

3. The method of claim 1, wherein said metal-silicide material is tungsten silicide.

4. The method of claim 1, wherein said gate insulation layer is a layer of high-k insulating material.

5. The method of claim 1, wherein said first metal layer is comprised of titanium nitride.

6. The method of claim 1, wherein performing said at least one process operation to selectively form said metal-silicide material layer only on said first metal layer within said NMOS gate cavity but not on said first metal layer within said PMOS gate cavity comprises:
    depositing a silicon-containing material layer so as to overfill said NMOS gate cavity and said PMOS gate cavity;
    performing an etching process so as to recess an upper surface of said silicon-containing material layer and thereby result in a first portion of said silicon-containing material layer being positioned on said first metal layer within said NMOS gate cavity and a second portion of said silicon-containing material layer being positioned on said first metal layer within said PMOS gate cavity;
    forming a masking layer that covers said NMOS gate cavity but leaves said PMOS gate cavity exposed;
    with said masking layer in place, removing said second portion of said silicon-containing material layer within said PMOS gate cavity so as to thereby expose said first metal layer within said PMOS gate cavity;
    removing said masking layer;
    depositing a second metal layer on said first portion of said silicon-containing material layer positioned within said NMOS gate cavity and on said exposed first metal layer within said PMOS gate cavity;
    converting at least a portion of said first portion of said silicon-containing material layer within said NMOS gate cavity into a metal silicide material that is positioned on said first metal layer in said NMOS gate cavity; and forming gate cap layers within said NMOS and PMOS gate cavities.

7. A method of forming replacement gate structures for an NMOS transistor and a PMOS transistor, comprising:
performing at least one etching process to remove a sacrificial gate structure for said NMOS transistor and a sacrificial gate structure for said PMOS transistor to thereby define an NMOS gate cavity and a PMOS gate cavity;
depositing a gate insulation layer in said NMOS gate cavity and in said PMOS gate cavity;
depositing a first metal layer on said gate insulation layer in said NMOS gate cavity and in said PMOS gate cavity;
performing at least one first process operation to form a silicon-containing material layer on said first metal layer in said NMOS gate cavity and on said first metal layer within said PMOS gate cavity;
performing at least one second process operation to selectively remove said silicon-containing material layer from within said PMOS gate cavity while leaving said silicon-containing material layer positioned within said NMOS gate cavity and thereby expose said first metal layer within said PMOS gate cavity;
depositing a second metal layer on said silicon-containing material layer within said NMOS gate cavity and on said exposed first metal layer within said PMOS gate cavity;
converting at least a portion of said silicon-containing material layer within said NMOS gate cavity into a metal-silicide material that is positioned on said first metal layer in said NMOS gate cavity; and
forming gate cap layers within said NMOS and PMOS gate cavities.

8. The method of claim 7, wherein said metal-silicide material is a silicide of a refractory metal or a transition metal.

9. The method of claim 7, wherein said metal-silicide material is tungsten silicide.

10. The method of claim 7, wherein said silicon-containing material is comprised of polysilicon or amorphous silicon.

11. The method of claim 7, wherein said sacrificial gate structures are comprised of a silicon dioxide gate insulation layer and a polysilicon gate electrode positioned above said silicon dioxide gate insulation layer.

12. The method of claim 7, wherein said first metal layer is titanium nitride, said silicon-containing material layer is comprised of polysilicon or amorphous silicon and said second metal layer is tungsten.

13. The method of claim 7, wherein, after forming said metal-silicide material, a portion of said second metal layer remains positioned on said metal-silicide material within said NMOS cavity.

14. The method of claim 7, wherein performing said at least one first process operation comprises:
depositing said silicon-containing material layer so as to over-fill said NMOS gate cavity and said PMOS gate cavity; and
performing an etching process so as to recess an upper surface of said silicon-containing material layer and thereby result in a first portion of said silicon-containing material layer being positioned on said first metal layer within said NMOS gate cavity and a second portion of said silicon-containing material layer being positioned on said first metal layer within said PMOS gate cavity.

15. The method of claim 14, wherein performing said at least one second process operation comprises:
forming a masking layer that covers said NMOS gate cavity but leaves said PMOS gate cavity exposed; and
with said masking layer in place, removing said second portion of said silicon-containing material layer within said PMOS gate cavity so as to thereby expose said first metal layer within said PMOS gate cavity.

16. A method of forming replacement gate structures for an NMOS transistor and a PMOS transistor, comprising:
performing at least one etching process to remove a sacrificial gate structure for said NMOS transistor and a sacrificial gate structure for said PMOS transistor to thereby define an NMOS gate cavity and a PMOS gate cavity;
depositing a high-k gate insulation layer in said NMOS gate cavity and in said PMOS gate cavity;
depositing a first metal layer on said high-k gate insulation layer in said NMOS gate cavity and in said PMOS gate cavity;
depositing a silicon-containing material layer so as to over-fill said NMOS gate cavity and said PMOS gate cavity;
performing an etching process so as to recess an upper surface of said silicon-containing material layer and thereby result in a first portion of said silicon-containing material layer being positioned on said first metal layer within said NMOS gate cavity and a second portion of said silicon-containing material layer being positioned on said first metal layer within said PMOS gate cavity;
forming a masking layer that covers said NMOS gate cavity but leaves said PMOS gate cavity exposed;
with said masking layer in place, removing said second portion of said silicon-containing material layer within said PMOS gate cavity so as to thereby expose said first metal layer within said PMOS gate cavity;
removing said masking layer;
depositing a second metal layer on said first portion of said silicon-containing material layer positioned within said NMOS gate cavity and on said exposed first metal layer within said PMOS gate cavity;
performing a planarization process to remove portions of said second metal layer and thereby define a first portion of the second metal layer positioned within the NMOS gate cavity on the first portion of said silicon-containing material layer and a second portion of the second metal layer positioned within the PMOS gate cavity on the exposed first metal layer;
converting at least a portion of said first portion of said silicon-containing material layer within said NMOS gate cavity into a metal-silicide material that is positioned on said first metal layer in said NMOS gate cavity;
forming a gate cap layer within said NMOS gate cavity above said metal-silicide material; and
forming a gate cap layer within said PMOS gate cavity above said second portion of said second metal layer.

17. The method of claim 16 wherein said step of converting said at least a portion of said first portion of said silicon-containing material layer within said NMOS gate cavity into said metal-silicide material is performed such that a part of said first portion of said second metal layer remains positioned on said metal-silicide material within said NMOS cavity.

18. An integrated circuit product, comprising:
an NMOS transistor having an NMOS gate structure comprised of:
an NMOS gate insulation layer comprised of a high-k gate insulation material;
a first NMOS metal layer comprised of a first metal positioned on said NMOS gate insulation layer;

a metal silicide material positioned on said first NMOS metal layer, wherein said metal silicide material is a silicide of a second metal; and a second NMOS metal layer comprised of said second metal positioned on and in direct physical contact with said metal silicide material; and a PMOS transistor having a PMOS gate structure comprised of:
  a PMOS gate insulation layer comprised of said high-k gate insulation material;
  a first PMOS metal layer comprised of said first metal positioned on said PMOS gate insulation layer; and
  a second PMOS metal layer comprised of said second metal positioned on said first PMOS metal layer.

19. The integrated circuit product of claim 18, wherein said first metal is titanium nitride.

20. The integrated circuit product of claim 18, wherein said second metal is tungsten.

21. The integrated circuit product of claim 18, wherein said second metal is one of a refractory metal or a transition metal.

22. The integrated circuit product of claim 18, wherein said NMOS transistor further comprises a first gate cap layer positioned on said second NMOS metal layer and said PMOS transistor comprises a second gate cap layer positioned on said second PMOS metal layer.

23. An integrated circuit product, comprising:
an NMOS transistor having a first gate structure;
a first sidewall spacer positioned laterally adjacent to sidewalls of said first gate structure, wherein said first gate structure is comprised of:
  an NMOS gate insulation layer comprised of a high-k gate insulation material and having a horizontal NMOS gate insulation layer portion positioned above a channel region of said NMOS transistor and vertical NMOS gate insulation layer portions positioned laterally adjacent to said first sidewall spacer;
  a first NMOS metal layer comprised of a first metal and having a horizontal NMOS metal portion positioned on said horizontal NMOS gate insulation layer portion and vertical NMOS metal portions positioned laterally adjacent to respective vertical NMOS gate insulation layer portions; and
  a metal silicide material positioned on and in direct physical contact with said horizontal and vertical NMOS layer portions of said first NMOS metal layer; and
a PMOS transistor having a second gate structure comprised of:
  a PMOS gate insulation layer comprised of said high-k gate insulation material;
  a first PMOS metal layer comprised of said first metal positioned on said PMOS gate insulation layer; and
  a second PMOS metal layer positioned on said first PMOS metal layer.

24. The integrated circuit product of claim 23, wherein said NMOS transistor further comprises a first insulating gate cap layer positioned on said metal silicide material and said PMOS transistor comprises a second insulating gate cap layer positioned on said second PMOS metal layer.

25. The integrated circuit product of claim 24, wherein said NMOS transistor comprises a first sidewall spacer defining a first gate cavity and said PMOS transistor comprises a second sidewall spacer defining a second gate cavity, said first gate structure and said first insulating cap layer being positioned in said first gate cavity and said second gate structure and said second insulating cap layer being positioned in said second gate cavity.

26. The integrated circuit product of claim 18, wherein said metal silicide material is in direct physical contact with said first NMOS metal layer.

27. The integrated circuit product of claim 22, wherein said NMOS transistor comprises a first sidewall spacer defining a first gate cavity and said PMOS transistor comprises a second sidewall spacer defining a second gate cavity, said gate structure of said NMOS transistor and said first cap layer being positioned in said first gate cavity and said gate structure of said PMOS transistor and said second cap layer being positioned in said second gate cavity.

28. The integrated circuit product of claim 18, further comprising a sidewall spacer positioned laterally adjacent to sidewalls of said NMOS gate structure, wherein said NMOS gate insulation layer comprises a horizontal gate insulation layer portion positioned above a channel region of said NMOS transistor and vertical gate insulation layer portions positioned laterally adjacent to said sidewall spacer and wherein said first NMOS metal layer comprises a horizontal metal layer portion positioned above said horizontal gate insulation layer portion and vertical metal layer portions positioned laterally adjacent to respective vertical gate insulation layer portions.

29. The integrated circuit product of claim 28, wherein said metal silicide material and said second NMOS metal layer each contact said vertical metal layer portions of said first NMOS metal layer.

30. The integrated circuit product of claim 23, further comprising a second sidewall spacer positioned laterally adjacent to sidewalls of said second gate structure, wherein said PMOS gate insulation layer comprises a horizontal PMOS gate insulation layer portion positioned above a channel region of said PMOS transistor and vertical PMOS gate insulation layer portions positioned laterally adjacent to said second sidewall spacer, wherein said first PMOS metal layer comprises a horizontal PMOS metal portion positioned on said horizontal PMOS gate insulation layer portion and vertical PMOS metal portions positioned laterally adjacent to respective vertical PMOS gate insulation layer portions, and wherein said second PMOS metal layer is in direct physical contact with said horizontal and vertical PMOS layer portions of said first PMOS metal layer.

* * * * *